United States Patent [19]

Nakagawa et al.

[11] Patent Number: 5,596,276
[45] Date of Patent: Jan. 21, 1997

[54] CAVITY RESONATOR FOR AN ELECTRON SPIN RESONATOR

[75] Inventors: Kazuo Nakagawa; Makoto Tsuneda; Atsushi Nukanobu, all of Tokyo; Akio Nakanishi; Akira Furuse, both of Osaka, all of Japan

[73] Assignees: Nikkiso Co., Ltd., Tokyo; Sumitomo Special Metals Co., Osaka, both of Japan

[21] Appl. No.: 447,928

[22] Filed: May 23, 1995

Related U.S. Application Data

[63] Continuation of Ser. No. 73,594, Jun. 8, 1993, abandoned.

[30] Foreign Application Priority Data

Jun. 9, 1992 [JP] Japan .................... 4-147857

[51] Int. Cl.⁶ .................................................. G01R 33/20
[52] U.S. Cl. .................................................. 324/316
[58] Field of Search .................................... 324/316, 317, 324/318, 300; 333/227, 248, 208

[56] References Cited

U.S. PATENT DOCUMENTS

| | | | |
|---|---|---|---|
| 3,122,703 | 2/1964 | Rempel et al. | 324/0.5 |
| 3,197,692 | 7/1965 | Hyde | 324/0.5 |
| 3,250,985 | 5/1966 | Hyde et al. | 324/0.5 |
| 3,609,520 | 9/1971 | Sneed, Jr. | 333/227 |
| 3,628,184 | 12/1971 | Thompson | 333/227 |
| 3,701,959 | 10/1972 | Hansen | 333/83 R |
| 3,732,488 | 5/1973 | Franconi | 324/316 |
| 3,757,204 | 12/1973 | Hyde | 324/316 |
| 3,878,454 | 4/1975 | Hyde | 333/227 |
| 4,249,148 | 2/1981 | Jachowski | 324/148 |
| 4,918,049 | 5/1990 | Cohn | 333/227 |
| 5,302,898 | 5/1994 | Pethig et al. | 324/316 |

OTHER PUBLICATIONS

K. Romanowski et al., "Eddy Current Induction In Flat Screen Of A microwave Cavity", IEEE Transactions On Magnetics, vol. 20, No. 5, 1 Sep. 1985, New York, NY, pp. 1945–1946.

S. K. De, "Improved Rectangular Cavity For EPR In TE₁₀₂ Mode", Review of Scientific Instruments, vol. 58, No. 1, 1 Jan. 1987, New York, NY, pp.–133–134.

I. M. Brown et al., "An X-Band EPR Cavity For Fast Magnetic Field Sweep Experiments", Review of Scientific Instruments, vol. 38, No. 5, 1 May 1967, New York, NY, pp.–695–696.

*Primary Examiner*—Sandra L. O'Shea
*Assistant Examiner*—Raymond Y. Mah
*Attorney, Agent, or Firm*—Orrick Herrington & Sutcliffe

[57] ABSTRACT

The invention provides a cavity resonator for an electron spin resonance device in which modulation coils for generating a modulation magnetic field to be applied to a sample in the cavity resonator are arranged at an exterior of the cavity resonator. The cavity resonator comprises a body being rectangular-defined by predetermined length, width and height. The body has a pair of side walls being vertical to the modulation magnetic field. The side wall respectively have at least thin portions of a thickness being nearly equal to or less than a skin depth of a skin effect appearing at the side walls. The modulation coils are arranged on the thin portions so as to have the modulation magnetic field be transmitted through the thin portions into the interior of the cavity resonator. Alternatively, it is possible that inner walls of the body are overlaid with metallic foils having at least sufficiently smaller thickness than a skin depth of a skin effect appearing at the walls.

14 Claims, 2 Drawing Sheets

CAVITY RESONATOR FOR AN ELECTRON SPIN RESONATOR

This is a continuation of application Ser. No. 08/073,594 filed on Jun. 8, 1993, now abandoned.

BACKGROUND OF THE INVENTION

The invention relates to an electron spin resonator, and more particularly to a cavity resonator for an electron spin resonator.

For electron spin resonators, a sensitivity in detection is one of the most important factors. In the prior arts, it seems to be general for improvement in the sensitivity in detection to utilize a superimposition of a modulation magnetic field with a frequency on a polarizing static magnetic field for an amplification and subsequent detection of only a signal component which appears in the electron spin resonance. It is desirable to suppress a low frequency noise due to a signal amplification. This requires the modulation magnetic field to have a possible high frequency but in a responsible range of a microwave cavity resonator. For example, a 100 kHz frequency is generally available as the frequency of the modulation magnetic field. The modulation magnetic field is caused by applying a high frequency current to a modulation coil which is arranged either in an exterior or an interior of the cavity resonator. The former is an external modulation system and the latter is an internal modulation system.

The above two types of the cavity resonator are subject to the following problems respectively which will be described in detail.

Problems with the internal modulation type cavity resonator will be investigated in which the frequency of the modulation magnetic field is 100 kHz. The Q factor of the cavity resonator is associated with the sensitivity of detection of the electron spin resonator. Of course, it is desirable that the Q factor have a possible high value. In the internal modulation type cavity resonator, the arrangement of the modulation coil within the cavity resonator, however, causes the Q factor to be lowered. The suppression of lowering the Q factor requires the modulation coil to receive restrictions in the number of turns and in the turn ratio. Physically, the number of turns of the modulation coil is restricted down to one or two turns. That is why it is difficult to obtain a high efficiency in generation Of the modulation magnetic field by such a modulation coil. The generation of a necessary modulation magnetic field for causing the electron spin resonance requires applying an extensive large modulation current to such the modulation coil having less number of turns. The accomplishment of the electron spin resonance requires such a precise operation as to suppress a leakage of microwave that appears where wires of the modulation coil penetrate the wall of the cavity resonator. The extensive large modulation current flowing in the wire of the modulation coil causes a rise of temperature of the wire of the modulation coil at a penetrated portion of the cavity resonator wall and thereby a looseness at the penetrated portion often appears.

On the other hand, although the external modulation type cavity resonator is free from the above mentioned problems, that it has the following problems. In this case, as the modulation coil is arranged at the exterior of the cavity resonator, the modulation magnetic field is required to penetrate the wall of the cavity resonator. Since the wall of the cavity resonator is made of a conductive material, the modulation magnetic field or alternating magnetic field penetrating the cavity resonator wall causes an eddy current to appear around the penetrated portion of the cavity resonator so as to suppress the magnetic field. As a result, the eddy current prevents the transmission of the modulation magnetic field through the wail of the cavity resonator, resulting in a considerable reduction of the transmittivity of the modulation magnetic field through the wall of the cavity resonator. When a $TE_{102}$ rectangular cavity resonator having a side wall thickness of approximately 1.2 mm is used, the intensity of the original modulation magnetic field of 100 kHz, which appears at the exterior of the cavity resonator, is considerably attenuated down to $10^{-4}$ times thereof or less. So it is difficult to secure a necessary intensity of the modulation magnetic field at the interior of the cavity resonator. Such an insufficient intensity of the modulation magnetic field results in an inferiority in the sensitivity of the cavity resonator. Even if not so, it provides a restriction to the improvement in the sensitivity of the cavity resonator. Securing a necessary intensity of the modulation magnetic field at the interior of the cavity resonator requires further generating an extensive large modulation magnetic field at the exterior of the cavity resonator, which is of course undesirable.

The external modulation type cavity resonator is further subject to the following problem. As described above, as the modulation coil is arranged at the exterior of the cavity resonator, the modulation magnetic field appearing at the modulation coil is transmitted through the wall of the cavity resonator into the interior thereof. The transmission of the modulation magnetic field through the cavity resonator wall generates an eddy current at the cavity resonator wall. The eddy current exhibits an interference with the static magnetic field applied to the cavity resonator. The interference between the eddy current and the static magnetic field causes the cavity resonator to exhibit an oscillation whose frequency is almost equal to the frequency of the modulation magnetic field. This provides a great deal of influence to the sensitivity of the cavity resonator. Namely, this results in a remarkable inferiority in the sensitivity of the cavity resonator.

To settle the above two problems with the external modulation type cavity resonator, it has been proposed to apply a low frequency modulation magnetic field to the cavity resonator, the reason of which is as follows. When the modulation magnetic field has a relatively high frequency, the eddy current caused by that has also a relatively high frequency. Such a high frequency eddy current at the wall of The cavity resonator shows the skin effect having a skin depth which is inversely proportional to the square root of the frequency of the eddy current. The frequency of the modulation magnetic field is almost equal to that of the eddy current. When the frequency of the modulation magnetic field becomes small, the skin depth of the skin effect of the eddy current becomes large. The frequency of the modulation magnetic field is so lowered that the skin depth of the skin effect of the eddy current becomes nearly equal to the thickness of the wall of the cavity resonator. This prevents the attenuation of the intensity of the modulation magnetic field when it penetrates the wall of the cavity resonator. For example, the frequency of the modulation magnetic field is required to be lowered down to about 10 Hz to 300 Hz for preventing the attenuation of the intensity of the modulation magnetic field. In this case, since the frequency of the modulation magnetic field is low, as described above the sensitivity of the cavity resonator is forced to suffer the inferior affection by the low frequency noise which appears in the signal amplifier.

To settle all of the above problems with the above both cavity resonator types, it is thus required to develop a quite novel cavity resonator for electron spin resonators which both is free from an extensive large modulation current and is able to secure a necessary intensity of the modulation magnetic field at the interior of the cavity resonator without undesirable oscillation of the cavity resonator for implementation of a high sensitive detection of the electron spin resonance.

SUMMARY OF THE INVENTION

Accordingly, it is a primary object of the present invention to provide a novel cavity resonator for an electron spin resonator.

It is a further object of the present invention to provide a novel cavity resonator for an electron spin resonator, which is able to implement a high sensitive detection of electron span resonance.

It is a still further object of the present invention to provide a novel cavity resonator for an electron spin resonator, which is free from undesirable oscillation of the cavity resonator.

It is yet a further object of the present invention to provide a novel cavity resonator for an electron spin resonator, which is able to secure a necessary intensity of a modulation magnetic field at an interior of the cavity resonator without an extensive large current.

The above and other objects, features and advantages of the present invention will be apparent from the following descriptions.

The present invention provides a novel cavity resonator for an electron spin resonance device in which modulation coils for generating a modulation magnetic field to be applied to a sample in the cavity resonator are arranged at an exterior of the cavity resonator. The cavity resonator comprises a rectangular-defined body by predetermined length, width and height. The body of the cavity resonator has a pair of side walls being vertical to the modulation magnetic field. The side walls of the body of the cavity resonator respectively have at least thin portions of a thickness being nearly equal to or less than a skin depth of a skin effect appearing at the side walls. The modulation coils are arranged on the thin portions so as to have the modulation magnetic field be transmitted, i.e., irradiated, through the thin portions into the interior of the cavity resonator.

Alternatively, the rectangular-defined body has inner walls being overlaid with metallic foils having at least sufficiently smaller thickness than a skin depth of a skin effect appearing at the walls.

BRIEF DESCRIPTION OF THE DRAWINGS

Preferred embodiments of the present invention will hereinafter be described in detail with reference to the accompanying drawings.

PREFERRED EMBODIMENTS OF THE INVENTION

Figure 1:
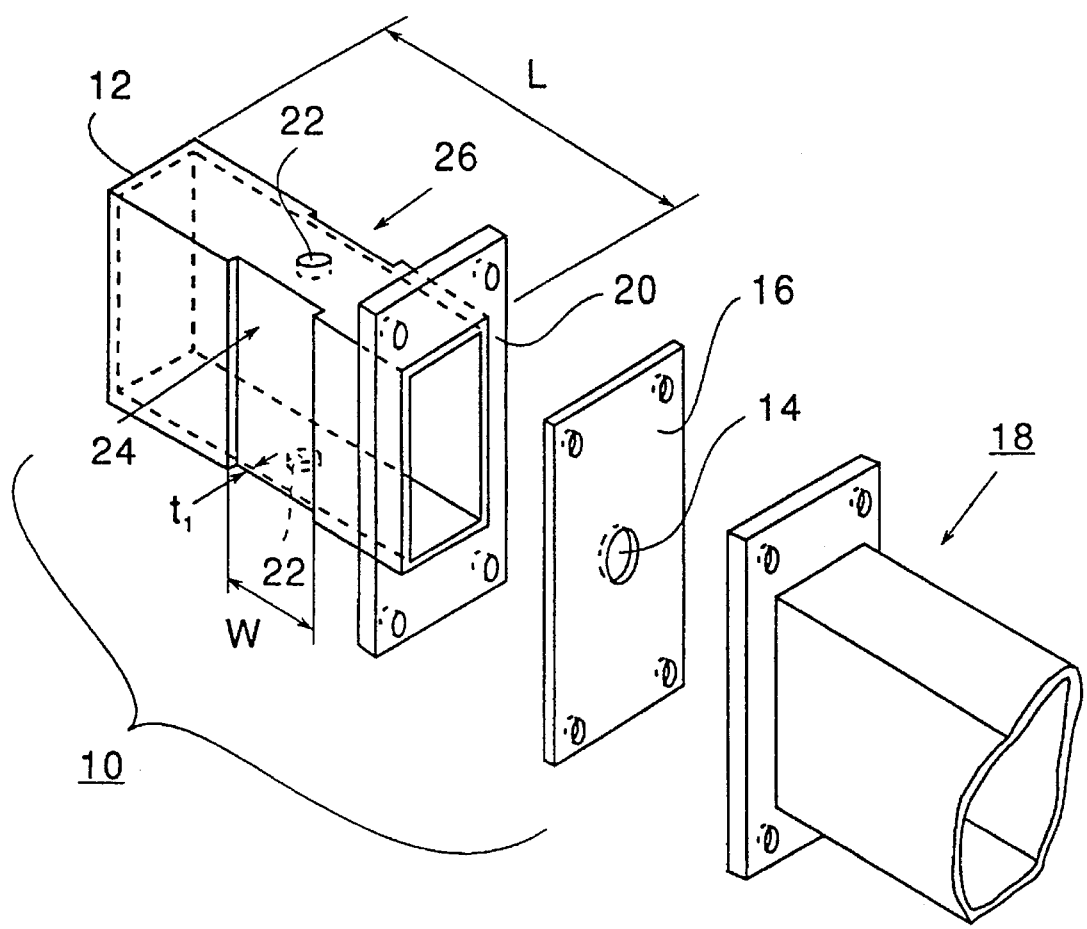
FIG. 1 is a perspective view illustrative of a novel cavity resonator for the electron spin resonator in a first embodiment according to the present invention.

A first embodiment of the present invention will be described with reference to FIG. 1. The first embodiment of the present invention provides a novel cavity resonator 10 of the X-band rectangular $TE_{102}$ mode. The novel cavity resonator 10 has a rectangular-shaped body being defined by a cavity length L which is equal to a wave-length of a wave guide 18. The wave-guide 18 is provided to connect the cavity resonator 10 and a micro-wave circuit which is not illustrated. The body of the cavity resonator 10 is closed at its one end with a copper plate 12 which may be combined by use of either soldering or brazing. The body of the cavity resonator 10 has at its opposite end a flange 20 which is to combine the body of the cavity resonator 10 and a plate 16 made of a conductive material. The plate 16 is to combine the flange 20 of the cavity resonator 10 and the wave-guide 18. The plate 16 has at its center portion a through hole 14 whose diameter is so defined as to be adjusted to a reflection coefficient provided by measurement conditions. The body of the cavity resonator 10 further has opposite H-faces or upper and bottom walls being respectively formed at the center portion with through holes 22 and 22 through which the sample is introduced into the cavity resonator 10.

The body of the cavity resonator 10 has E-faces or opposite side walls which have respectively non-uniform thicknesses. Namely, the side walls of the body of the cavity resonator respectively have thin portions 24 and 26, each of which has a smaller thickness than that of the other portion of the side wall of the cavity resonator body. The thin portions 24 and 26 of the side walls of the cavity resonator body are respectively defined by a width W and the same height as the body of the cavity resonator 10. The thin portions 24 and 26 are represented as depressed portions in the external shape on the side walls of the cavity resonator body so that magnetic field modulation coils 25 and 27 respectively are accommodated in the depressed portions. The width W of the thin portions 24 and 26 is so defined as to be equal to the width of the E-faces of the rectangular body of the cavity resonator 10. Further, the width W of the thin portions 24 and 26 is almost equal to the width of the magnetic field modulation coil so as to secure an uniformity of the modulation magnetic field to be applied to the sample in the rectangular cavity resonator body.

The thin portions 24 and 26 of the rectangular body of the cavity resonator 10 have a thickness $t_1$ which is so defined as almost equal to or less than a skin depth of the skin effect represented by the high frequency of the modulation magnetic field. The skin depth of the skin effect depends upon a material of the cavity resonator body. For example, it is available that the thickness of the thin portions 24 and 26 is in the-range from 30 micrometers to 100 micrometers when the rectangular body of the cavity resonator 10 is made of copper. Physically, the thin portion 24 and 26 may be formed by etching the side walls or the E-faces of the cavity resonator body by mechanical processes or electro polishing methods. Such the thickness $t_1$ in the range from 30 micrometers to 100 micrometers is available for the strength of the thin portion. Further, since the modulation coils are arranged on the thin portions 24 and 26 of the cavity resonator body, the strength of the thin portions 24 and 26 is improved.

Such the thickness of the thin portions 24 and 26 of the rectangular body of the cavity resonator 10 is so thin as to allow the modulation magnetic field to be transmitted from the modulation coils into the interior of the cavity resonator body without suffering a large attenuation. A transmission coefficient of the modulation magnetic field is in the range from 53% to 28% which allows securing a necessary intensity of the modulation magnetic field in the interior of the rectangular cavity resonator body. The necessary intensity of the modulation magnetic field applied to the sample at the interior of the cavity resonator 10 is able to cause the electron spin resonance for a high sensitive detection. It is not necessary for securing the required intensity of the modulation magnetic field to apply any extensive large current. The novel cavity resonator is also free from undesirable oscillation thereof.

Although the first embodiment of the present invention provides the novel X-band rectangular $TE_{102}$ mode cavity resonator, the present invention is of course applicable to other types of the cavity resonator such as K-band or Q-band type cavity resonator. Because K-band or Q-band type resonators are relatively small, it is possible that the entire dimension of each of the side walls of the cavity resonator is formed of the thin portion whose thickness is equal to or less than the skin depth of the skin effect.

Figure 2:
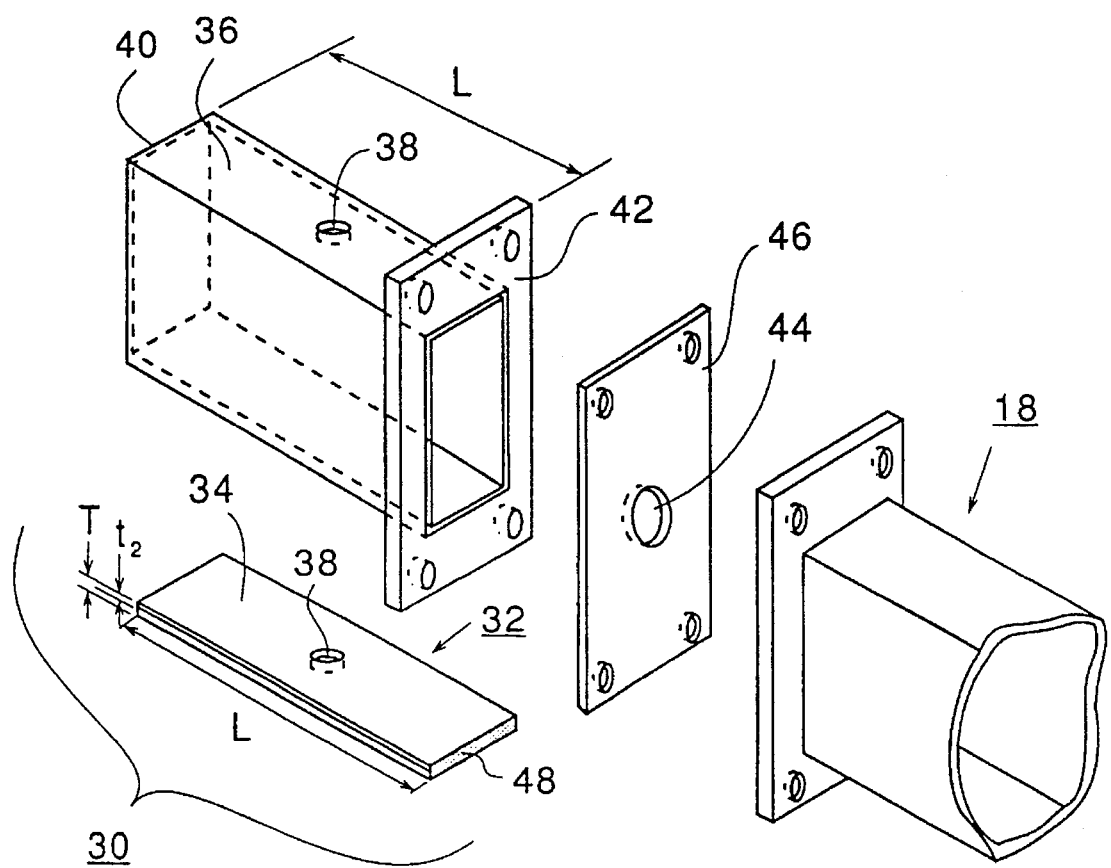
FIG. 2 is a perspective view illustrative of a novel cavity resonator for the electron spin resonator in a second embodiment according to the present invention.

A second embodiment of the present invention will be described with reference to FIG. 2. The second embodiment of the present invention provides another novel cavity resonator 30 of the X-band rectangular $TE_{102}$ mode. The novel cavity resonator 30 has a rectangular-shaped body being defined by a cavity length L which is equal to a wave-length of a wave guide 18, The cavity resonator 30 may be formed of ceramic substrates for printed circuit boards or microwave integrated circuit boards, The waveguide 18 is to connect the cavity resonator 30 and a micro-wave circuit which is not illustrated, The body of the cavity resonator 30 is closed at its one end with a ceramic plate 40, The body of the cavity resonator 30 has at its opposite end a flange 42 which is to combine the body of the cavity resonator 30 and a plate 46 made of a conductive material, The plate 46 is to combine the flange 42 of the cavity resonator 30 and the wave-guide 18, The plate 46 has at its center portion a through hole 44 whose diameter is so defined as to be adjusted to a reflection coefficient provided by measurement conditions, The body of the cavity resonator 30 further has upper and bottom walls 36 and 32 being respectively formed at the center portion with through holes 38 and 38 through which the sample is introduced into the cavity resonator 30. The body of the cavity resonator 30 also has opposite side walls which have respectively a uniform thickness, The bottom wall 32 receives at its edge faces a plating process by use of gold. Further, an inner wall of the cavity resonator also receives at its edge faces a plating process by use of gold for improvement in a conductivity and in the Q factor.

The novel cavity resonator provided by the second embodiment is different from that of the first embodiment in that each of inner walls of the rectangular cavity resonator 30 is overlaid with a metallic foil 34 which has a thickness $t_2$. The each wall of the cavity resonator 30 may comprise a combination of the ceramic plate for the printed circuit board with the metallic foil 34 whose thickness is 30 micrometers in which the total thickness T of each the cavity resonator wall is 1.2 millimeters. In this case, a 68% of the transmission coefficient of the modulation magnetic field is obtained. Alternatively, the each wall of the cavity resonator 30 may comprise a combination of the ceramic plate for the microwave integrated circuit board with the metallic foil 34 whose thickness is in the range from 3 micrometers to 20 micrometers. The thickness of the metallic foil 34 overlaying each the wall of the cavity resonator 30 is so defined as to be sufficiently smaller than that of the skin depth of the skin effect. In this case, the modulation magnetic field applied to the sample at the interior of the cavity resonator shows almost zero attenuation. This allows securing a necessary intensity of the modulation magnetic field in the interior of the rectangular cavity resonator body. The necessary intensity of the modulation magnetic field applied to the sample at the interior of the cavity resonator 10 is able to cause the electron spin resonance for a high sensitive detection. It is not necessary for securing the required intensity of the modulation magnetic field to apply any extensive large current. The novel cavity resonator is also free from undesirable oscillation thereof. Such the cavity resonator is attractive in the facility of manufacturing and a low cost due to using materials commercially available.

Whereas modifications of the present invention will no doubt be apparent to a person having the ordinary skill in the art, to which the invention pertains, it is to be understood that the embodiments shown and described by way of illustrations are by no means intended to be considered in a limiting sense. Accordingly, it is to be intended to cover by claims all modifications which fall within the spirit and scope of the invention.

What is claimed is:

1. A cavity resonator for an electron spin resonance device in which the modulation coils for generating a modulation magnetic field to be applied to a sample in said cavity resonator are arranged at an exterior of the cavity resonator, said cavity resonator comprising:

a body being rectangular-defined by predetermined length, width and height, said body having a pair of side walls being vertical to a polarizing magnetic field, said side walls each respectively being a unitary material having a single recessed area portion of a uniform thickness being less than a skin depth of a skin effect appearing at said side wall, said modulation coils being arranged on said single recessed area portions so as to have said modulation magnetic field be irradiated through said recessed area portions into the interior of said cavity resonator.

2. The cavity resonator as claimed in claim 1, wherein said recessed area portions formed in said side walls of said cavity resonator have the same height as said cavity resonator.

3. The cavity resonator as claimed in claim 1, wherein said recessed area portions respectively from the entire dimensions of said side walls of said cavity resonator.

4. The cavity resonator as claimed in claim 1, wherein said recessed area portions respectively have a thickness in the range from 30 micrometers to 100 micrometers, and wherein said side walls are made of copper.

5. The cavity resonator as claimed in claim 1, wherein said cavity resonator has a pair of top and bottom walls respectively having through holes, through which a sample is introduced into the interior of said cavity resonator.

6. The cavity resonator as claimed in claim 1, wherein said cavity resonator has a flange for being connected to a waveguide through a metallic plate having a hole.

7. A cavity resonator apparatus for generating a modulation magnetic field to be applied to a sample in said cavity resonator comprising:

a rectangular body having a height, length, and width, the body having a pair of side walls oriented vertical to a polarizing magnetic field, said side walls each being a unitary material having a first thickness and a first area corresponding to the height and length of the body and having a single recess having a second thickness smaller than the first thickness and a recessed area not greater than the first area, the second thickness being less than a skin depth of a skin effect appearing at said side wall; and a pair of modulation coils arranged on said pair of side wall recesses respectively, said modulation coils generating the modulation magnetic field which is irradiated through said recesses into the cavity resonator.

8. The cavity resonator as claimed in claim 7, wherein said recesses in said side walls of said cavity resonator have both the same height and width as said cavity resonator body.

9. The cavity resonator as claimed in claim 7, wherein said side walls are made of copper.

10. The cavity resonator as claimed in claim 9, wherein said second thickness is in the range from 30 micrometers to 100 micrometers.

11. The cavity resonator as claimed in claim 7, wherein said cavity resonator has a top wall and a bottom wall respectively having through holes, through which a sample is introduced into the interior of said cavity resonator.

12. The cavity resonator as claimed in claim 7, wherein said cavity resonator has a flange for being connected to a waveguide through a metallic plate having a hole.

13. The apparatus of claim 1 wherein each side wall having a recessed area portion has a surface interior to the cavity, the surface comprising a smooth plane.

14. The apparatus of claim 7 wherein each side wall having a recessed area portion has a surface interior to the cavity, the surface comprising a smooth plane.

* * * * *

UNITED STATES PATENT AND TRADEMARK OFFICE
CERTIFICATE OF CORRECTION

PATENT NO.: 5,596,276

DATED: January 21, 1997

INVENTOR(S): Nakagawa et al.

It is certified that error appears in the above-identified patent and that said Letters Patent is hereby corrected as shown below:

Column 1, line 46, delete "Of" and insert --of--;
Column 1, Line 62, delete "that";
Colums 2, line 48, delete "The" and insert --the--;
Column 3, line 19, delete "span" and insert --spin--;
Column 4, line 48, after "the" delete "-";
Column 5, line 29, delete "," and insert --.--;
Column 5, line 32, delete "," and insert --.--;
Column 5, line 33, delete "," and insert --.--;
Column 5, line 36, delete "," and insert --.--;
Column 5, line 42, delete "," and insert --.--;
Column 6, line 40, delete "from" and insert --form--.

Signed and Sealed this

Eighth Day of December, 1998

*Attest:*

*Attesting Officer*

BRUCE LEHMAN

*Commissioner of Patents and Trademarks*